(12) United States Patent
Yokoyama et al.

(10) Patent No.: US 8,890,335 B2
(45) Date of Patent: Nov. 18, 2014

(54) SEMICONDUCTOR DEVICE

(71) Applicant: Panasonic Corporation, Osaka (JP)

(72) Inventors: Kenji Yokoyama, Kyoto (JP); Takeshi Kawabata, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/132,074

(22) Filed: Dec. 18, 2013

(65) Prior Publication Data

US 2014/0103536 A1   Apr. 17, 2014

Related U.S. Application Data

(63) Continuation of application No. PCT/JP2012/005480, filed on Aug. 30, 2012.

(30) Foreign Application Priority Data

Mar. 14, 2012   (JP) .................................. 2012-057022

(51) Int. Cl.
| | |
|---|---|
| *H01L 23/48* | (2006.01) |
| *H01L 23/52* | (2006.01) |
| *H01L 29/40* | (2006.01) |
| *H01L 23/00* | (2006.01) |
| *H01L 25/065* | (2006.01) |

(52) U.S. Cl.
CPC ............ *H01L 24/20* (2013.01); *H01L 25/0657* (2013.01); *H01L 24/46* (2013.01); *H01L 2224/04105* (2013.01); *H01L 2224/16145* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01); *H01L 2924/15311* (2013.01); *H01L 2225/0651* (2013.01); *H01L 2225/06513* (2013.01)
USPC ........................... 257/777; 257/686; 257/691

(58) Field of Classification Search
USPC .................................. 257/691, 686, 777, 778
See application file for complete search history.

(56) References Cited

U.S. PATENT DOCUMENTS

| | | | |
|---|---|---|---|
| 8,664,776 B2 * | 3/2014 | Yamamoto | .................... 257/786 |
| 2005/0199994 A1 | 9/2005 | Morishita et al. | |

(Continued)

FOREIGN PATENT DOCUMENTS

| | | |
|---|---|---|
| JP | 2005-39134 | 2/2005 |
| JP | 2005-260053 | 9/2005 |
| JP | 2008-159607 | 7/2008 |

(Continued)

OTHER PUBLICATIONS

International Search Report of PCT Application No. PCT/JP2012/005480 dated Nov. 27, 2012.

*Primary Examiner* — Sheila V. Clark
(74) *Attorney, Agent, or Firm* — Panasonic Patent Center

(57) ABSTRACT

A semiconductor device includes: on an upper surface of a second semiconductor chip on a circuit board, a ring dam section formed at an outer circumference of a mounting region above which a first semiconductor chip is mounted; and an interconnect extending from the dam section to a center section of the first semiconductor chip or the second semiconductor chip in a region in which the first semiconductor chip faces the second semiconductor chip. The interconnect is electrically connected to a connection terminal on a circuit formation surface of the first or second semiconductor chip at the center section of the first or second semiconductor chip. The dam section and the interconnect are power supply interconnects or ground interconnects.

17 Claims, 7 Drawing Sheets

(56) References Cited

U.S. PATENT DOCUMENTS

| | | |
|---|---|---|
| 2008/0150157 A1 | 6/2008 | Nishimura et al. |
| 2009/0302483 A1 | 12/2009 | Lin et al. |
| 2010/0187671 A1* | 7/2010 | Lin et al. ................ 257/686 |
| 2010/0289128 A1* | 11/2010 | Camacho et al. ............ 257/670 |
| 2011/0133321 A1 | 6/2011 | Ihara |
| 2013/0062777 A1* | 3/2013 | Ogata ........................ 257/774 |

FOREIGN PATENT DOCUMENTS

| | | |
|---|---|---|
| JP | 2009-76518 | 4/2009 |
| JP | 2010-141080 | 6/2010 |
| JP | 2011-119609 | 6/2011 |

* cited by examiner

SEMICONDUCTOR DEVICE

CROSS-REFERENCE TO RELATED APPLICATIONS

This is a continuation of International Application No. PCT/JP2012/005480 filed on Aug. 30, 2012, which claims priority to Japanese Patent Application No. 2012-057022 filed on Mar. 14, 2012. The entire disclosures of these applications are incorporated by reference herein.

BACKGROUND

The present disclosure relates to semiconductor devices, and specifically, to a semiconductor device having a chip on chip (CoC) structure.

As technologies for fabricating semiconductor devices continue to progress in miniaturization, the number of transistors constituting a large-scale integration circuit (LSI) continues to increase. Moreover, as components, in particular, systems of the LSI become complex and increase in scale, memory capacity required by a system LSI may possibly increase, and thus, for the system LSI on which a large-scale memory is mounted, there is a need for a highly efficient mounting method.

On the other hand, as a method for connecting the LSI and a package, a wire bonding method and a flip chip method have been widely used. When the wire bonding method or the flip chip method is used in mounting memory devices, the memory devices have to be mounted in a chip of the system LSI, on a chip mounting substrate, or on a mounting substrate. This results in limitation on mount capacity, an increase in mounting area on the substrate, an increase in mounting cost, or the like. To solve the problem, a CoC structure has been used.

As illustrated in FIG. 10, a semiconductor device 900 having a common CoC structure includes an upper semiconductor chip 901 and a lower semiconductor chip 902 each having a circuit formation surface and a plurality of pads (not shown) on the circuit formation surface. The upper semiconductor chip 901 and the lower semiconductor chip 902 are disposed so that their circuit formation surfaces face each other, and are electrically connected to each other via a plurality of bumps 904 disposed on the plurality of pads. A region between the upper semiconductor chip 901 and the lower semiconductor chip 902 is filled with an underfill resin 905. The lower semiconductor chip 902 has pads for wire bonding (not shown) which are provided outside a region in which the semiconductor chip 902 is mounted, and the lower semiconductor chip 902 is electrically connected to the substrate 903 via wires 906. The semiconductor chips 901 and 902 and the wires 906 are entirely covered with a molding resin 907.

With the CoC structure, the plurality of semiconductor chips 901 and 902 can be mounted on the substrate 903, so that chips can be connected to each other with space between the chips being saved compared to the commonly used wire bonding method and the flip chip method.

Incidentally, in the case of the CoC structure illustrated in FIG. 10, power is supplied to the upper semiconductor chip 901 via the lower semiconductor chip 902, which causes a problem where a voltage drop (IR drop) occurs due to an insufficient power supply voltage to the upper semiconductor chip 901. Moreover, since the lower semiconductor chip 902 is covered with the upper semiconductor chip 901, power cannot be supplied from above directly to a center section of the lower semiconductor chip 902. Therefore, a voltage drop also occurs in supplying power to the center section of the lower semiconductor chip 902. That is, the influence of the voltage drop varies the working speed of the transistors of the LSI, which affects the operation timing of the LSI unless the influence the voltage drop is taken into consideration. This may result in malfunctions of the LSI and severe problems relating to the yield, etc.

To solve the above-discussed problems, Japanese Unexamined Patent Publication No. 2008-159607 describes a semiconductor device having a CoC structure, wherein positions of a plurality of semiconductor chips stacked on an interconnect substrate are shifted from each other so that power is supplied from the substrate directly to upper ones of the semiconductor chips.

Japanese Unexamined Patent Publication No. 2011-119609 describes a semiconductor device including a substrate and a conductive pattern formed as a dam on a principal surface of the substrate to solve a problem where an underfill flows and extends in flip-chip mounting, wherein power supply capacitance is generated by the formed conductive pattern to stabilize power to chips.

Japanese Unexamined Patent Publication No. 2010-141080 describes a semiconductor device having a CoC structure, wherein a semiconductor logic circuit chip smaller than a semiconductor memory chip is stacked on the semiconductor memory chip to reduce the size of the semiconductor device.

SUMMARY

It is a prerequisite for the semiconductor device described in Japanese Patent Publication No. 2008-159607 that the stacking positions of the upper ones of the semiconductor chips are shifted from positions of lower ones of the chips. Thus, power supply from the substrate directly to the chips is possible only at one surface of each chip which faces the substrate. Therefore, stable supply of power in a chip surface is not possible. Moreover, shifting the chips from each other increases the area of a resin substrate on which the chips are mounted, which increases the dimension of the substrate, thereby increasing cost.

In the semiconductor device described in Japanese Patent Publication No. 2011-119609, the conductive pattern as a dam section generates power supply capacitance in the flip-chip method. It can be expected that a power supply capacitance component allows stable supply of power to the chips and noise is effectively reduced, but the effect on a voltage drop of the power at center sections of the chips is limited.

It is a prerequisite for the semiconductor device described in Japanese Patent Publication No. 2010-141080 that an upper chip stacked above a lower chip has to be smaller than the lower chip. When the lower chip is small, the semiconductor device cannot have the CoC structure.

To solve the above-discussed problems, the present disclosure provides a semiconductor device including a plurality of semiconductor chips connected to each other to have a CoC structure, wherein independently of the relationship in the dimension of upper and lower chips, power is stably supplied to center sections of the upper and lower chips in CoC mounting with a low cost.

An aspect of a semiconductor device according to the present disclosure includes: a first semiconductor chip disposed with a circuit formation surface of the first semiconductor chip facing downward; a second semiconductor chip above which the first semiconductor chip is mounted such that the circuit formation surface of the first semiconductor chip faces a circuit formation surface of the second semiconductor chip; a base on which the second semiconductor chip is mounted; a first interconnect having a ring shape and formed on the circuit formation surface of the second semiconductor chip to overlap an outer circumference or part of a circumferential section of a mounting region above which the first semiconductor chip is mounted; and a second interconnect formed in a region in which the first semiconductor chip faces the second semiconductor chip, the second interconnect extending from the first interconnect to a center section of the first semiconductor chip or the second semiconductor chip, wherein at the center section of the first semiconductor chip or the second semiconductor chip, the second interconnect is electrically connected to a connection terminal on the circuit formation surface of the first semiconductor chip or the second semiconductor chip, and the first interconnect and the second interconnect are power supply interconnects or ground interconnects.

Another aspect of the semiconductor device according to the present disclosure includes: a first semiconductor chip disposed with a circuit formation surface of the first semiconductor chip facing downward; a second semiconductor chip which has an extension section formed from a side surface of the second semiconductor chip toward outside, and above which the first semiconductor chip is mounted such that the circuit formation surface of the first semiconductor chip faces a circuit formation surface of the second semiconductor chip; a base on which the second semiconductor chip is mounted; a first interconnect having a ring shape and formed on the circuit formation surface of the second semiconductor chip or on an upper surface of the extension section to overlap an outer circumference or part of a circumferential section of a mounting region above which the first semiconductor chip is mounted; and a second interconnect formed in a region in which the first semiconductor chip faces the second semiconductor chip, the second interconnect extending from the first interconnect to a center section of the first semiconductor chip or the second semiconductor chip, wherein the second interconnect is electrically connected to a connection terminal on the circuit formation surface of the first semiconductor chip or the second semiconductor chip at the center section of the first semiconductor chip or the second semiconductor chip, and the first interconnect and the second interconnect are power supply interconnects or ground interconnects.

Another aspect of the semiconductor device according to the present disclosure includes: a first semiconductor chip disposed with a circuit formation surface of the first semiconductor chip facing downward; a second semiconductor chip which has an extension section formed from a side surface of the second semiconductor chip toward outside, and above which the first semiconductor chip is mounted such that the circuit formation surface of the first semiconductor chip faces a circuit formation surface of the second semiconductor chip; a base on which the second semiconductor chip is mounted; a ring interconnect on the circuit formation surface of the second semiconductor chip or on an upper surface of the extension section, the ring interconnect overlapping an outer circumference or part of a circumferential section of a mounting region above which the first semiconductor chip is mounted; and a re-distribution interconnect section extending over the circuit formation surface of the second semiconductor chip and the upper surface of the extension section in a region in which the first semiconductor chip faces the second semiconductor chip, the re-distribution interconnect being electrically connected to the ring interconnect, wherein the re-distribution interconnect section is electrically connected to a connection terminal on the circuit formation surface of the first semiconductor chip or the second semiconductor chip at a center section of the first semiconductor chip or the second semiconductor chip, and the ring interconnect and the re-distribution interconnect section are power supply interconnects or ground interconnects.

According to the present disclosure, a semiconductor device includes a plurality of semiconductor chips connected to each other to have a CoC structure, wherein independently of the relationship in the dimension of upper and lower chips, power can be stably supplied to center sections of the upper and lower chips in CoC mounting with a low cost.

BRIEF DESCRIPTION OF THE DRAWINGS

FIGS. 1A and 1B schematically illustrates a semiconductor device according to an embodiment, wherein FIG. 1A is a cross-sectional view taken along the line Ia-Ia of FIG. 1B, and FIG. 1B is a plan view.

FIGS. 7A and 7B schematically illustrates a semiconductor device according to a sixth variation of the embodiment, wherein FIG. 7A is a cross-sectional view taken along the line VIIa-VIIa of FIG. 7B, and FIG. 7B is a plan view.

DETAILED DESCRIPTION

Figure 1A:
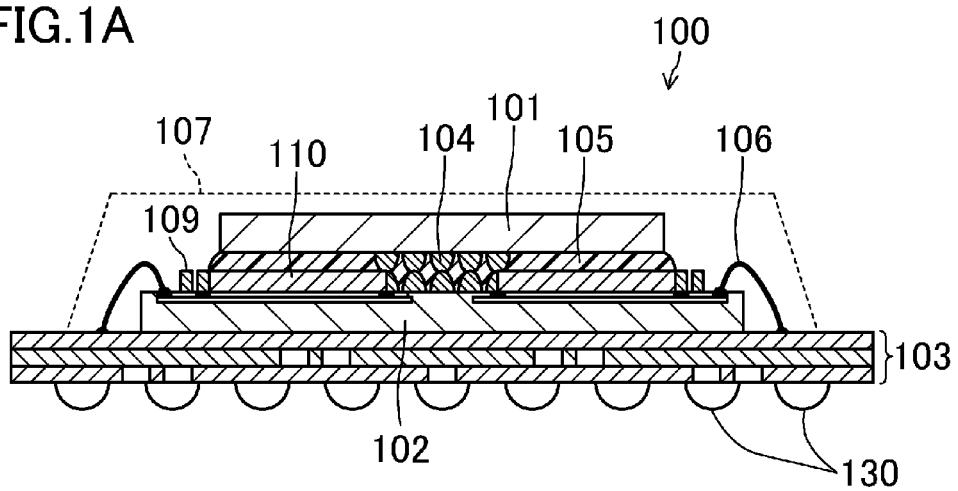

A semiconductor device of the present embodiment will be described with reference to the drawings. The same reference numerals are used to represent equivalent elements in the drawings and the explanation thereof will be accordingly omitted.

Embodiment

Figure 1B:
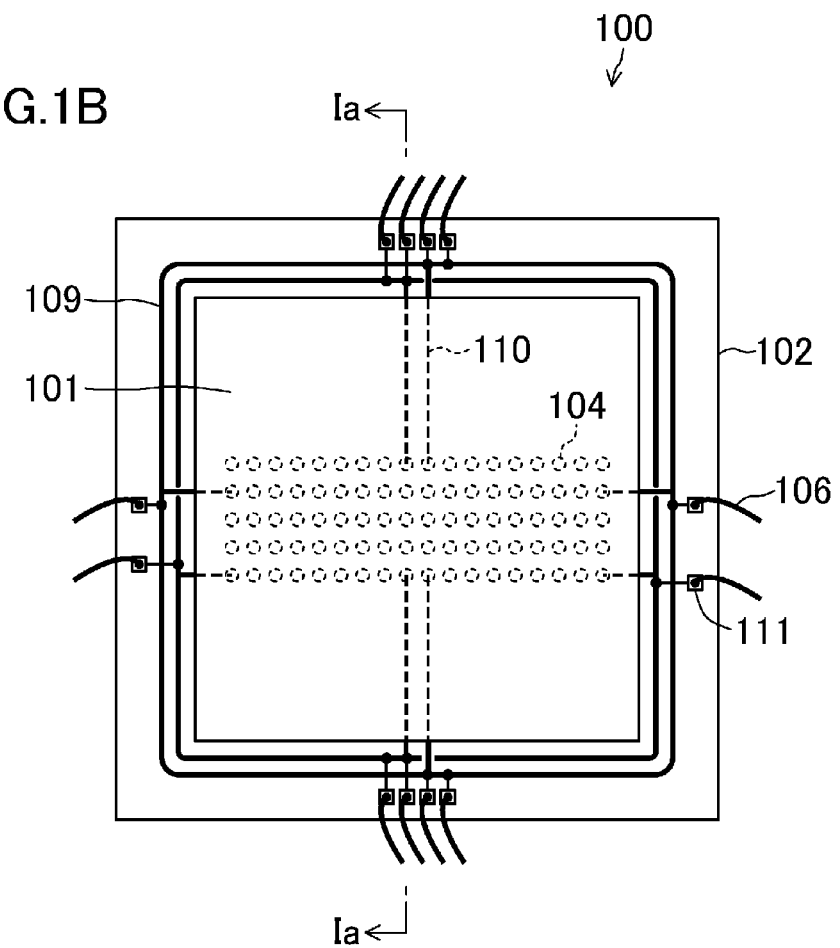

FIGS. 1A and 1B schematically illustrate a cross-sectional configuration and a plan configuration of a semiconductor device according to the present embodiment.

As illustrated in FIG. 1A, a semiconductor device 100 includes a first semiconductor chip 101 located at an upper position in a stacked structure, a second semiconductor chip 102 located at a lower position in the stacked structure, and a circuit board 103 on which the semiconductor chips 101 and 102 are mounted. A plurality of bumps 130 are provided on a surface of the circuit board 103 opposite to a surface on which the chips are mounted. The bumps 130 are electrically connected to the first semiconductor chip 101 or the second semiconductor chip 102.

A plurality of connection terminals (not shown) are provided on a circuit formation surface of the first semiconductor chip 101 and a circuit formation surface (upper surface) of the second semiconductor chip 102. The first semiconductor chip 101 and the second semiconductor chip 102 are electrically connected to each other via a plurality of bumps 104 on the connection terminals.

On the second semiconductor chip 102, a dam section 109 is formed outside a region above which the first semiconductor chip 101 is mounted. Between the first semiconductor chip 101 and the second semiconductor chip 102, a region surrounded by the dam section 109 is filled with an underfill resin 105. Wires 106 electrically connect the second semiconductor chip 102 to the substrate 103. The first semiconductor chip 101, the second semiconductor chip 102, and the wires 106 are encapsulated in a molding resin 107.

As illustrated in FIG. 1B, on the circuit formation surface of the second semiconductor chip 102, the dam section 109 is formed as a ring power supply (or ground) interconnect surrounding the region above which the first semiconductor chip 101 is mounted. Interconnects 110 extending from the dam section 109 to center sections of the semiconductor chips 101 and 102 are connected to the bumps 104 formed on the second semiconductor chip 102, thereby serving as power supply (or ground) interconnects.

The interconnects 110 can be formed in a step in which the bumps 104 are formed on the second semiconductor chip 102. For example, openings corresponding to regions in which the dam section 109, the interconnects 110, and the bumps 104 will be formed are formed in a resist film, electroplating of copper (Cu) and tin (Sn) is performed, and then the resist film is removed, thereby forming the interconnects 110 and the bumps 104. A constituent material of the dam section 109 and the interconnects 110 may be a metal material or a conductive material irrespective of the quality of the materials. It is more advantageous to use metal having a low resistance such as Cu, solder, nickel (Ni), gold (Au), aluminum (Al), or an alloy thereof.

When both a power supply interconnect and a ground interconnect are used, the dam section 109 is formed as a double-ring interconnect including an inner interconnect and an outer interconnect surrounding the inner interconnect, and part of the inner interconnect is cut so that the outer interconnect extends to a center section of a chip in a direction perpendicular to the cut part of the inner interconnect, thereby forming the power supply interconnect and the ground interconnect having different potentials.

With this configuration, the interconnects 110 extending to the center sections of the semiconductor chips 101 and 102 enable stable supply of power to the center sections of the semiconductor chips 101 and 102. As a result, it is possible to reduce a voltage drop of power to the center sections of the chips in CoC bonding. This can prevent a reduction in timing performance and malfunctions caused by, for example, variations in working speed of the transistors, so that it is possible to improve the performance and the reliability of the semiconductor device.

More specifically, the height of each of layers of the dam section 109 and the interconnects 110 is about 10 µm. When the height of a diffusion interconnect layer in each of the semiconductor chips 101 and 102 is about 1 µm, the height of each of the layers of the dam section 109 and the interconnects 110 is 10 times as large as the height of the diffusion interconnect layer. When the height of a re-distribution interconnect layer on each of the semiconductor chips 101 and 102 is about 3 µm, the height of each of the layers of the dam section 109 and the interconnects 110 is about three times as large as the height of the re-distribution interconnect layer. Thus, a component of interconnect resistance in the height direction of the dam section 109 and the interconnects 110 can be reduced to about ⅒ of that of the diffusion interconnect layer and to about ⅓ of that of the re-distribution interconnect layer. When the dam section 109 and the interconnects 110 are compared with the diffusion interconnect layer and the re-distribution interconnect layer in terms of the interconnect width, a ratio similar to the ratio of the above-described height is obtained. That is, the thickness of each interconnect layer which can be ensured and the voltage control effect which can be obtained are 10 or more times as large as those of the interconnect layer in each of the semiconductor chips 101 and 102, and three or more times as large as those of the re-distribution interconnect layer on each of the semiconductor chips 101 and 102.

With this configuration, a power source in which interconnects in each of the semiconductor chips 101 and 102 are arranged in a mesh pattern or extend in the longitudinal direction can also be stably supplied with power via the interconnects 110 from the ring power supply interconnect forming the dam section 109. It is also possible to reduce the influence of an inductor (L) component transferred from, for example, the wires 106 to the semiconductor chips 101 and 102 since the influence is transferred via the dam section 109, which is a ring power supply interconnect having a large thickness.

First Variation of Embodiment

Figure 2:
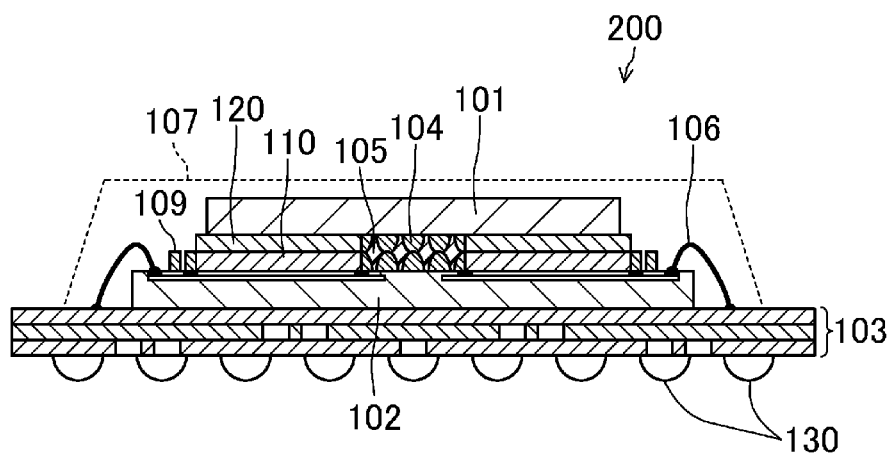
FIG. 2 is a cross-sectional view schematically illustrating a semiconductor device according to a first variation of the embodiment.

FIG. 2 illustrates a cross-sectional configuration of a semiconductor device 200 according to the present variation. As illustrated in FIG. 2, the semiconductor device 200 further includes interconnects 120 on a circuit formation surface of a first semiconductor chip 101 located above a second semiconductor chip 102, the interconnects 120 extending to center sections of the semiconductor chip 101 and the semiconductor chip 102. The first variation is different from the embodiment in that the interconnects 120 are connected to bumps 104 formed on the first semiconductor chip 101 and serve as power supply (or ground) interconnects.

With this configuration, since the interconnects 120 are provided on the circuit formation surface of the first semiconductor chip 101, and interconnects 110 are provided on a circuit formation surface of the second semiconductor chip 102, power can be more uniformly and stably supplied to the semiconductor chips 101 and 102. Therefore, it is possible to ensure reduction of a voltage drop at the center sections of the semiconductor chips 101 and 102.

Second Variation of Embodiment

Figure 3:
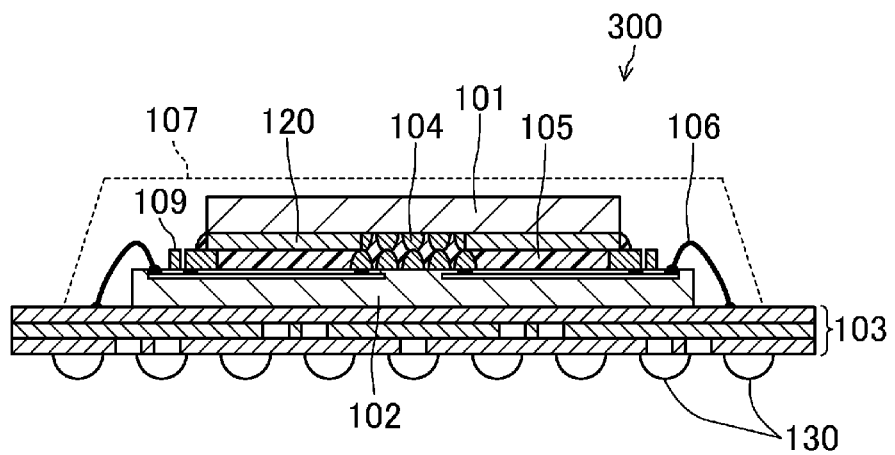
FIG. 3 is a cross-sectional view schematically illustrating a semiconductor device according to a second variation of the embodiment.

FIG. 3 illustrates a cross-sectional configuration of a semiconductor device 300 according to the present variation. As illustrated in FIG. 3, the semiconductor device 300 includes a dam section 109 on a circuit formation surface of a second semiconductor chip 102 located under a first semiconductor chip 101, and interconnects 120 on a circuit formation surface of the first semiconductor chip 101. The dam section 109 is formed as a ring power supply (or ground) interconnect surrounding a mounting region above which the first semiconductor chip 101 is mounted. The interconnects 120 extends from the dam section 109 to center sections of the semiconductor chip 101 and 102, and are connected to bumps 104 on the first semiconductor chip 101, so that the dam section 109 serves as the power supply (or ground) interconnect.

This configuration allows more stable supply of power to the upper first semiconductor chip 101 and can ensure reduction of a voltage drop at the center sections of the semiconductor chips 101 and 102.

Third Variation of Embodiment

Figure 4:
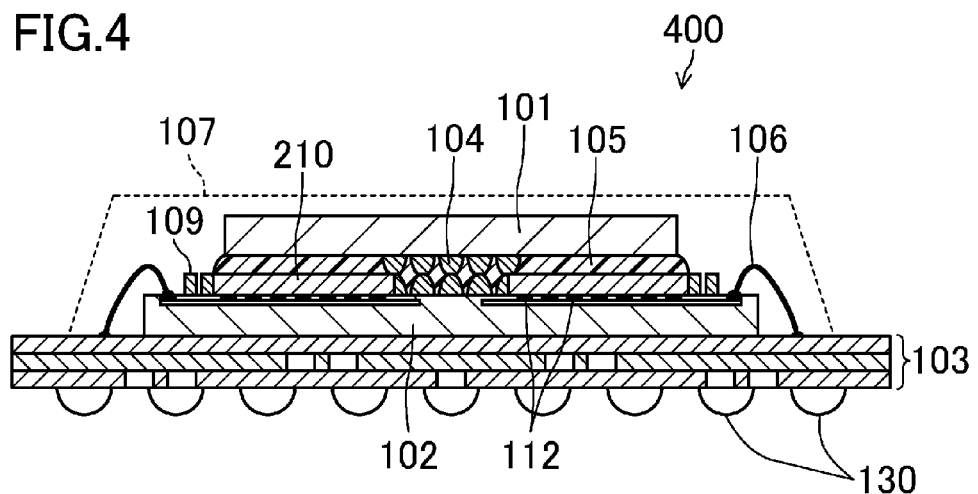
FIG. 4 is a cross-sectional view schematically illustrating a semiconductor device according to a third variation of the embodiment.

FIG. 4 illustrates a cross-sectional configuration of a semiconductor device 400 according to the present variation. As illustrated in FIG. 4, the semiconductor device 400 includes interconnects 210 on a circuit formation surface of a second semiconductor chip 102 located under a first semiconductor chip 101, the interconnects 210 extending to center sections of the semiconductor chips 101 and 102. The interconnects 210 are power supply interconnects which are connected to bumps 104 at the center sections of the semiconductor chips 101 and 102, and under surfaces of the interconnects 210 are connected to a plurality of pads 112 in upper portions of the semiconductor chip 102.

This configuration allows more stable supply of power to the center sections of the semiconductor chips 101 and 102 and the entirety of the second semiconductor chip 102, and can further ensure reduction of a voltage drop.

Fourth Variation of Embodiment

Figure 5:
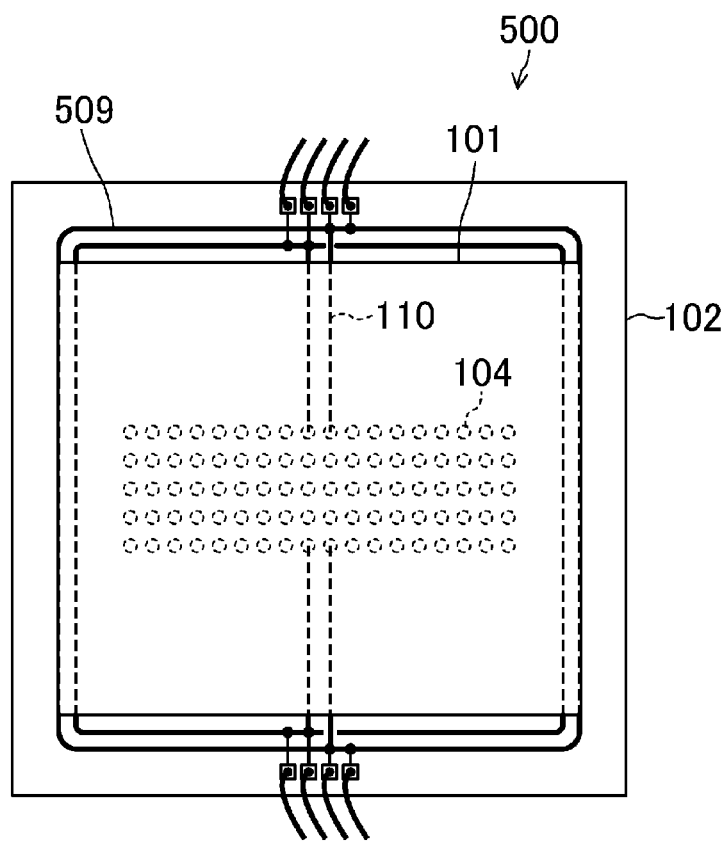
FIG. 5 is a cross-sectional view schematically illustrating a semiconductor device according to a fourth variation of the embodiment.

FIG. 5 illustrates a plan configuration of a semiconductor device 500 according to the present variation. As illustrated in FIG. 5, the semiconductor device 500 is different from the embodiment in that a power supply (or ground) interconnect which is a dam section 509 is not disposed outside a first semiconductor chip 101 located above a second semiconductor chip 102, but two opposing side edges of the first semiconductor chip 101 overlap the dam section 509.

This configuration allows effective supply of power to the side edges of the semiconductor chips 101 and 102 in addition to center sections of the semiconductor chips 101 and 102.

Note that the configuration of the dam section 509 according to the present variation is not limited to the configuration in which the two opposing side edges of the first semiconductor chip 101 overlap the dam section. For example, the dam section 509 may be configured such that at least part of a circumferential section of the first semiconductor chip 101 overlaps the dam section 509.

Fifth Variation of Embodiment

Figure 6:
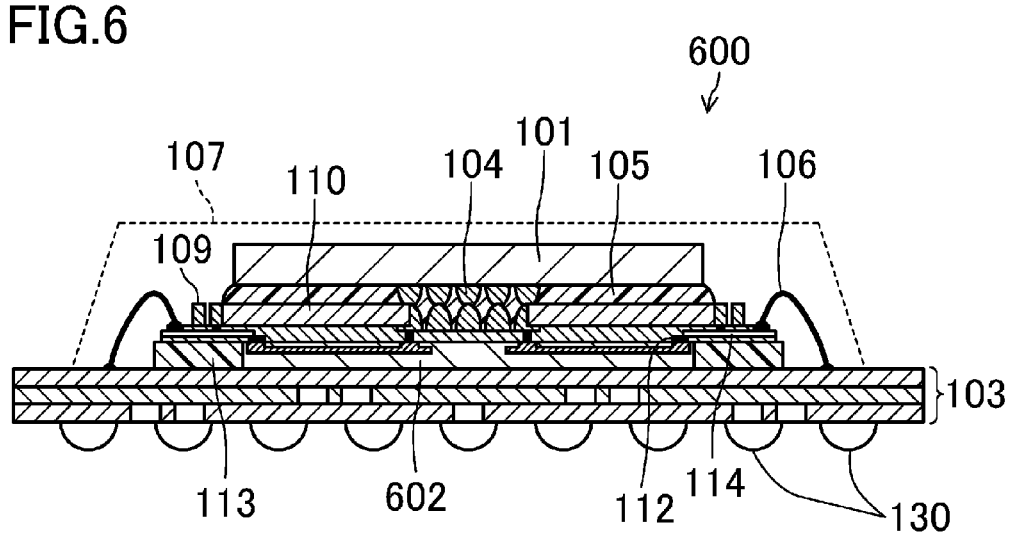
FIG. 6 is a cross-sectional view schematically illustrating a semiconductor device according to a fifth variation of the embodiment.

FIG. 6 illustrates a cross-sectional configuration of a semiconductor device 600 according to the present variation. As illustrated in FIG. 6, in the semiconductor device 600, the planar dimension of a second semiconductor chip 602 located under a first semiconductor chip 101 is smaller than that of the upper first semiconductor chip 101. With this configuration, edges of the second semiconductor chip 602 are located inside relative to the edges of the first semiconductor chip 101.

The second semiconductor chip 602 has an extension section 113 made of a resin material and extending outward from side surfaces of the second semiconductor chip 602 under the first semiconductor chip 101. Pads 112 and a re-distribution interconnect layer 114 included in a lead structure are formed from an edge of a circuit formation surface of the second semiconductor chip 602 over the extension section 113. The pads 112 are electrically connected to the re-distribution interconnect layer 114. Wires 106 electrically connect a circuit board 103 to the re-distribution interconnect layer 114 over the extension section 113.

Note that even when the planar dimension of the lower second semiconductor chip 602 is as large as or larger than that of the upper first semiconductor chip 101, a similar configuration including the extension section 113 and the re-distribution interconnect layer 114 is possible.

With this configuration, a dam section 109 can be formed independently of the relationship of the external dimensions of the semiconductor chips 101 and 602. Moreover, the dam section 109 and interconnects 110 connected to the dam section 109 allow more stable supply of power to center sections of the semiconductor chips 101 and 602. As a result, it is possible to further ensure reduction of a voltage drop. By using the extension section 113 made of a resin material, the width of the dam section 109 can be increased to, for example, about 100 μm to stabilize power. Therefore, more stable power can be ensured.

Sixth Variation of Embodiment

Figure 7A:
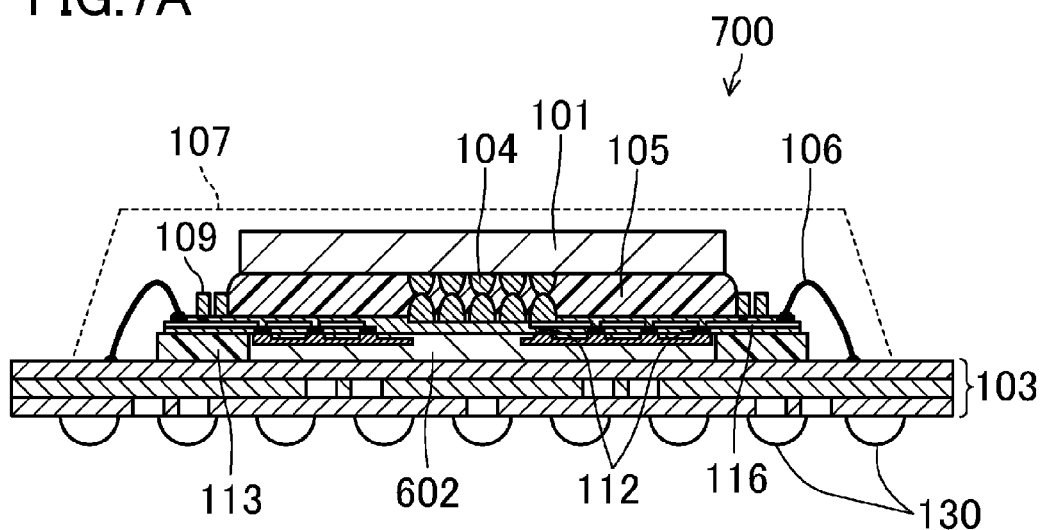
Figure 7B:
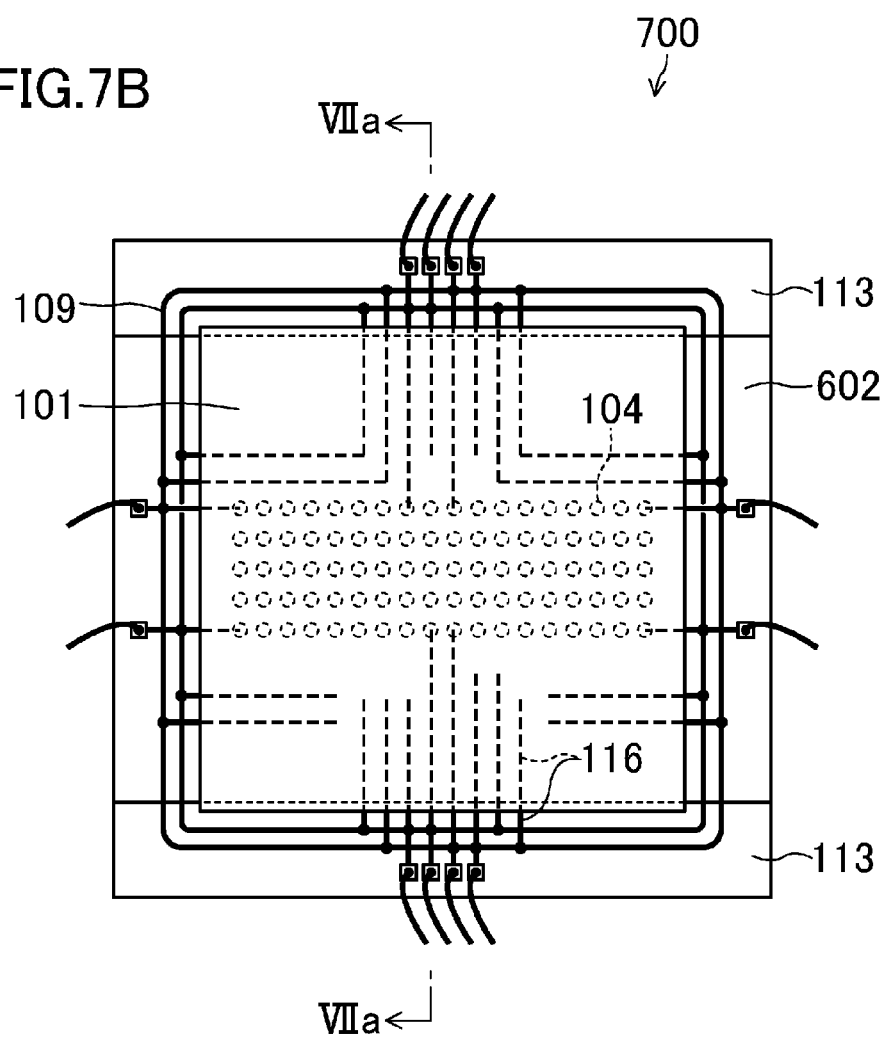

FIGS. 7A and 7B illustrate a cross-sectional configuration of a semiconductor device 700 according to the present variation. As illustrated in FIGS. 7A and 7B, in the semiconductor device 700, the planar dimension of a second semiconductor chip 602 located under a first semiconductor chip 101 is smaller than the upper first semiconductor chip 101. Thus, edges of the second semiconductor chip 602 are located inside relative to edges of the upper first semiconductor chip 101. The second semiconductor chip 602 has an extension section 113 made of a resin material and extending outward from side surfaces of the second semiconductor chip 602 under the first semiconductor chip 101. Pads 112 and a re-distribution interconnect layer 116 included in a lead structure are formed from edges of a circuit formation surface of the second semiconductor chip 602 over the extension section 113. The pads 112 are electrically connected to the re-distribution interconnect layer 116.

In the present variation, instead of the interconnects 110 connected to the dam section 109, a plurality of interconnects included in the re-distribution interconnect layer 116 extend to center sections of the semiconductor chips 101 and 602. The re-distribution interconnect layer 116 is electrically connected to the pads 112 in the second semiconductor chip 602. The re-distribution interconnect layer 116 is electrically connected to bumps 104 at the center sections. Note that part of the interconnect layer 116 on the way to the center sections may accordingly be connected to a plurality of pads 112 on the second semiconductor chip 602.

Wires 106 electrically connect a circuit board 103 to the re-distribution interconnect layer 116 over the extension section 113. This forms a configuration in which the second semiconductor chip 602 is electrically connected to the circuit board 103 via the wires 106, the re-distribution interconnect layer 116, and the pads 112.

Note that even when the planar dimension of the lower second semiconductor chip 602 is as large as or larger than that of the upper first semiconductor chip 101, a similar configuration including the extension section 113 and the re-distribution interconnect layer 116 is possible.

With this configuration, a dam section 109 can be formed independently of the relationship of the external dimensions of the semiconductor chips 101 and 602. Moreover, the dam section 109 and the re-distribution interconnect layer 116 connected to the dam section 109 allow more stable supply of power to the center sections of the semiconductor chips 101 and 602. As a result, it is possible to further ensure reduction of a voltage drop. By using the extension section 113 made of a resin material, the width of the dam section 109 can be increased to, for example, about 100 μm to stabilize power. Therefore, more stable power can be ensured.

Although the re-distribution interconnect layer 116 has been used instead of the interconnects 110, the re-distribution interconnect layer 116 can be used in addition to the interconnects 110. In this case, since the re-distribution interconnect layer 116 is used together with the interconnects 110 having a larger thickness and a larger width than the re-distribution interconnect layer 116, it is possible to further reduce interconnect resistance.

The embodiment and its variations of the present disclosure have been described. Matters that are common to both the embodiment and its variations will be further described. The reference numerals as shown in the embodiment are used, and the common matters are also applicable to the variations.

Figure 8:
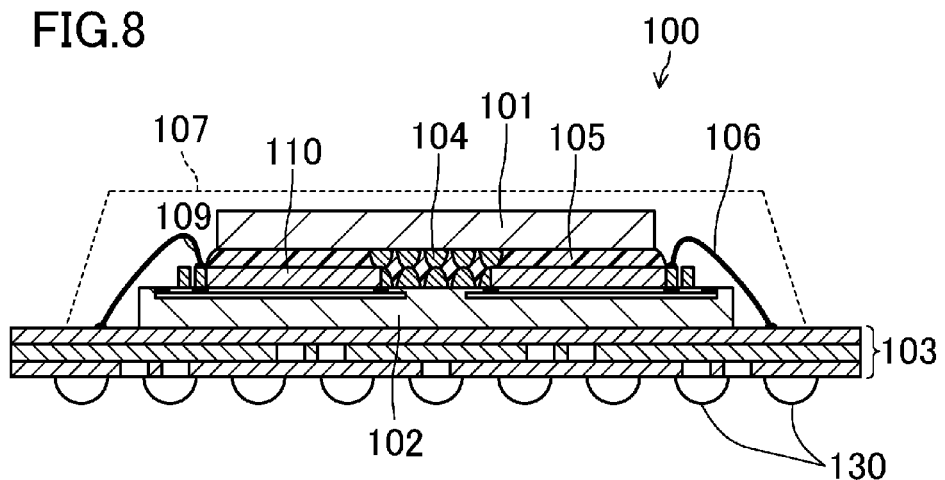
FIG. 8 is a cross-sectional view schematically illustrating another configuration of the semiconductor device according to the embodiment and its variations.

As illustrated in FIG. 8, the wires 106 may connect the circuit board 103 to the dam section 109.

Figure 9:
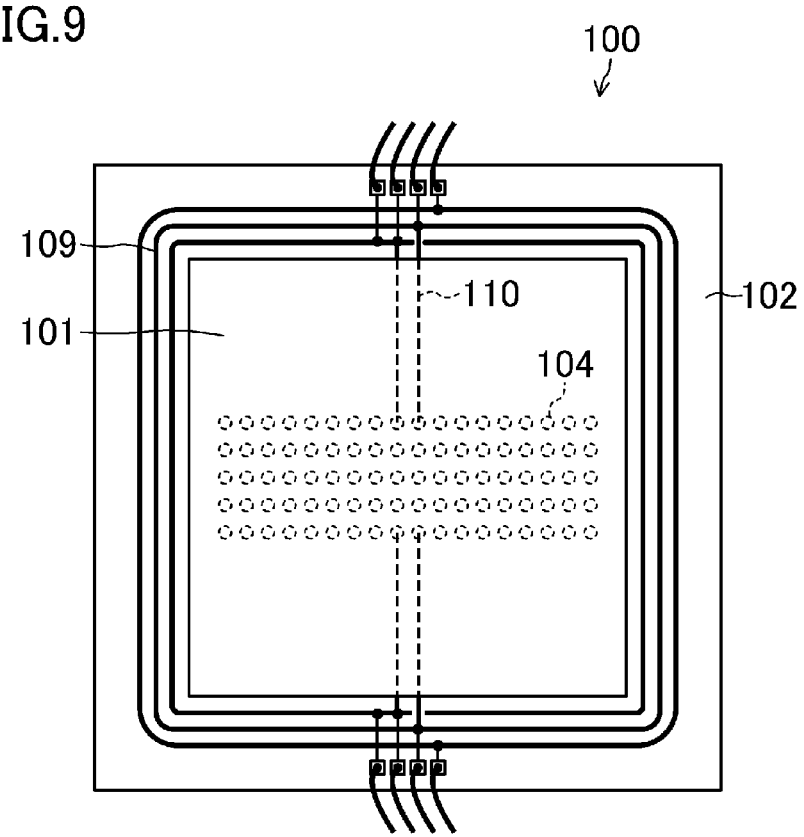
FIG. 9 is a plan view schematically illustrating still another configuration of a semiconductor device according to the embodiment and this variations.
Figure 10:
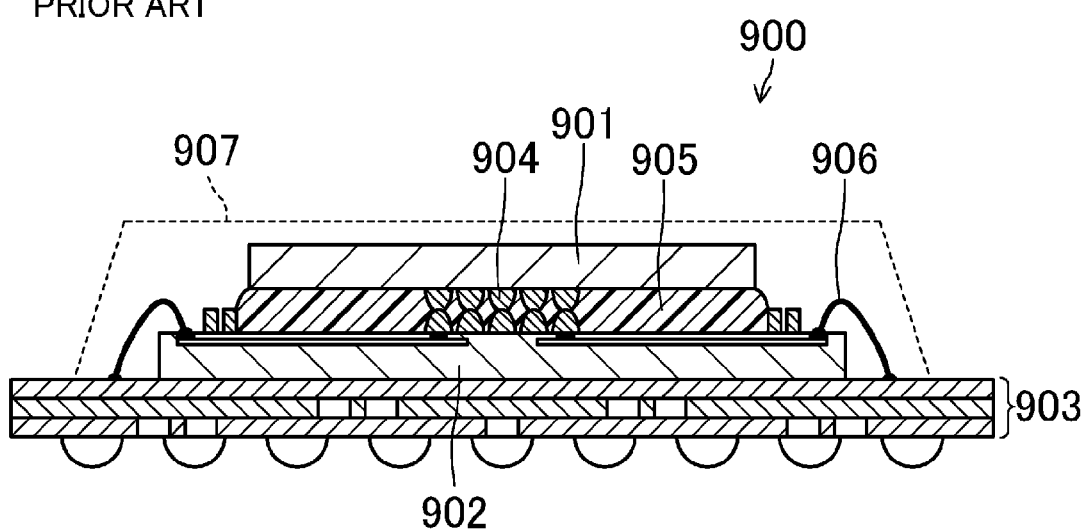
FIG. 10 is a cross-sectional view schematically illustrating a conventional semiconductor device having a common CoC structure.

Alternatively, as illustrated in FIG. 9, the dam section 109 may have a triple structure or a multiple structure including more than three ring interconnects.

The positions of the pads 111 connected to the wires 106 and also connected to the dam section 109 serving as a ring power supply interconnect are preferably located close to the interconnecting nodes between the dam section 109 and the interconnects 110.

It is not necessary that the interconnects 110 are connected to the bumps 104, but the interconnects 110 may pass through the lower second semiconductor chip 102 to supply power via pads on the second semiconductor chip 102.

In a plan view illustrating each variation, interconnects may be added in a direction crossing the interconnects 110 as in FIG. 1B illustrating the embodiment. Note that the power supply interconnects are preferably arranged in one direction so that the flow of the underfill resin 105 is not blocked.

The upper first semiconductor chip 101 may include a plurality of upper first semiconductor chips.

The application amount of the underfill resin 105 is adjusted to cover two interconnects forming a ring power supply (dam section 109) having a double structure, so that it is possible to reduce leakage or short circuits between the interconnects in the case of using both power and ground. Moreover, capacitance components increase, so that it is possible to further stabilize power.

The second semiconductor chip 102 has been mounted on the circuit board 103. However, a member on which the second semiconductor chip 102, and the like are mounted is not limited to the circuit board 103, but may be a lead frame.

It is not necessary that the interconnects 110 and the re-distribution interconnect layer 116 are connected to the bumps 104 at the center sections of the semiconductor chips 101 and 102, and the like. The interconnects 110 and the re-distribution interconnect layer 116 may be connected to predetermined pads of the semiconductor chips 101 and 102, and the like. With this configuration, power and ground are stabilized, and thus it is possible to reduce a voltage drop, or the like.

As described above, the present disclosure has been described in detail based on an embodiment and its variations, and an example of a fabrication method. However, the present disclosure is not limited to the above embodiment, and the like. Changes and modifications may be made without departing from the spirit of the present disclosure. For example, the scope of the present disclosure also includes configurations in which variations are combined together, or part of the components is substituted for an alternative which is not described in the embodiment, and the like.

A semiconductor device according to the present disclosure is widely applicable to electronic devices including semiconductor devices having a CoC structure.

What is claimed is:

1. A semiconductor device comprising:
a first semiconductor chip disposed with a circuit formation surface of the first semiconductor chip facing downward;
a second semiconductor chip above which the first semiconductor chip is mounted such that the circuit formation surface of the first semiconductor chip faces a circuit formation surface of the second semiconductor chip;
a base on which the second semiconductor chip is mounted;
a first interconnect having a ring shape and formed on the circuit formation surface of the second semiconductor chip to overlap an outer circumference or part of a circumferential section of a mounting region above which the first semiconductor chip is mounted; and
a second interconnect formed in a region in which the first semiconductor chip faces the second semiconductor chip, the second interconnect extending from the first interconnect to a center section of the first semiconductor chip or the second semiconductor chip, wherein
at the center section of the first semiconductor chip or the second semiconductor chip, the second interconnect is electrically connected to a connection terminal on the circuit formation surface of the first semiconductor chip or the second semiconductor chip, and
the first interconnect and the second interconnect are power supply interconnects or ground interconnects.

2. The semiconductor device of claim 1, wherein
the second semiconductor chip has a planar dimension larger than the first semiconductor chip.

3. The semiconductor device of claim 1, wherein
the second interconnect is disposed on the circuit formation surface of the first semiconductor chip.

4. The semiconductor device of claim 1, wherein
the second interconnect is disposed on the circuit formation surface of the second semiconductor chip.

5. The semiconductor device of claim 1, wherein
the base is connected to the first interconnect on the second semiconductor chip via a wire.

6. The semiconductor device of claim 1, wherein
the first interconnect includes a plurality of interconnects.

7. The semiconductor device of claim 1, wherein
the first interconnect is connected to a plurality of pads on the circuit formation surface of the second semiconductor chip.

8. A semiconductor device comprising:
a first semiconductor chip disposed with a circuit formation surface of the first semiconductor chip facing downward;
a second semiconductor chip which has an extension section formed from a side surface of the second semiconductor chip toward outside, and above which the first semiconductor chip is mounted such that the circuit formation surface of the first semiconductor chip faces a circuit formation surface of the second semiconductor chip;
a base on which the second semiconductor chip is mounted;
a first interconnect having a ring shape and formed on the circuit formation surface of the second semiconductor chip or on an upper surface of the extension section to overlap an outer circumference or part of a circumferential section of a mounting region above which the first semiconductor chip is mounted; and a second interconnect formed in a region in which the first semiconductor chip faces the second semiconductor chip, the second interconnect extending from the first interconnect to a center section of the first semiconductor chip or the second semiconductor chip, wherein the second interconnect is electrically connected to a connection terminal on the circuit formation surface of the first semiconductor chip or the second semiconductor chip at the center section of the first semiconductor chip or the second semiconductor chip, and the first interconnect and the second interconnect are power supply interconnects or ground interconnects.

9. The semiconductor device of claim 8, further comprising:

a re-distribution interconnect section extending over the circuit formation surface of the second semiconductor chip and the upper surface of the extension section in the region in which the first semiconductor chip faces the second semiconductor chip, the re-distribution interconnect section being electrically connected to the first interconnect.

10. The semiconductor device of claim 8, wherein the second interconnect is disposed on the circuit formation surface of the first semiconductor chip.

11. The semiconductor device of claim 8, wherein the second interconnect is disposed on the circuit formation surface of the second semiconductor chip.

12. The semiconductor device of claim 8, wherein the first interconnect includes a plurality of interconnects.

13. The semiconductor device of claim 8, wherein the first interconnect is connected to a plurality of pads on the circuit formation surface of the second semiconductor chip.

14. A semiconductor device comprising:

a first semiconductor chip disposed with a circuit formation surface of the first semiconductor chip facing downward;

a second semiconductor chip which has an extension section formed from a side surface of the second semiconductor chip toward outside, and above which the first semiconductor chip is mounted such that the circuit formation surface of the first semiconductor chip faces a circuit formation surface of the second semiconductor chip;

a base on which the second semiconductor chip is mounted;

a ring interconnect on the circuit formation surface of the second semiconductor chip or on an upper surface of the extension section, the ring interconnect overlapping an outer circumference or part of a circumferential section of a mounting region above which the first semiconductor chip is mounted; and a re-distribution interconnect section extending over the circuit formation surface of the second semiconductor chip and the upper surface of the extension section in a region in which the first semiconductor chip faces the second semiconductor chip, the re-distribution interconnect being electrically connected to the ring interconnect, wherein the re-distribution interconnect section is electrically connected to a connection terminal on the circuit formation surface of the first semiconductor chip or the second semiconductor chip at a center section of the first semiconductor chip or the second semiconductor chip, and the ring interconnect and the re-distribution interconnect section are power supply interconnects or ground interconnects.

15. The semiconductor device of claim 14, wherein the ring interconnect includes a plurality of interconnects.

16. The semiconductor device of claim 14, wherein the ring interconnect is connected to a plurality of pads on the circuit formation surface of the second semiconductor chip.

17. The semiconductor device of claim 14, wherein the base is connected to a pad on the re-distribution interconnect section of the extension section via a wire.

* * * * *